United States Patent [19]
Yamashita

[11] Patent Number: 4,926,485
[45] Date of Patent: May 15, 1990

[54] OUTPUT LEVEL CONTROL APPARATUS
[75] Inventor: Masayasu Yamashita, Saitama, Japan
[73] Assignee: Pioneer Electronic Corporation, Tokyo, Japan
[21] Appl. No.: 293,784
[22] Filed: Jan. 5, 1989
[30] Foreign Application Priority Data
  Mar. 11, 1988 [JP] Japan .................................. 63-58980
[51] Int. Cl.$^5$ ............................................. H03G 3/00
[52] U.S. Cl. ......................................... 381/107; 381/28
[58] Field of Search ................... 360/46; 381/104, 105, 381/107, 108, 109, 28

[56] References Cited
U.S. PATENT DOCUMENTS
4,297,527 10/1981 Pate ........................................ 381/107
4,539,692 9/1985 Munter ................................... 381/107
4,625,240 11/1986 Yablonski et al. ................... 381/104

FOREIGN PATENT DOCUMENTS
8704877 8/1987 PCT Int'l Appl. ................. 381/107

Primary Examiner—Forester W. Isen
Attorney, Agent, or Firm—Sughrue, Mion, Zinn, Macpeak & Seas

[57] ABSTRACT

An output level control apparatus which operates according to a reproduced signal level from a digital recording apparatus. The output level control apparatus includes a signal level detection device which compares the level of the reproduced signal with a predetermined level to decide if a level of the reproduced signal should be changed. The output level control apparatus further includes a device which attenuates the level of the reproduced signal to a suitable level when the signal level detection device determines that the reproduced signal should be changed.

10 Claims, 2 Drawing Sheets

OUTPUT LEVEL CONTROL APPARATUS

FIELD OF THE INVENTION

The present invention relates to an output level control apparatus utilized in a digital reproducing apparatus, and more particularly, the invention relates to an output level control apparatus which operates according to a reproduced signal level from a digital signal reproducing apparatus.

BACKGROUND OF THE INVENTION

An output level control apparatus utilized in an analog signal reproducing apparatus is well known in the prior art. Such an output level control apparatus conventionally includes a compressor and a limiter. The compressor works to suppress the level of the inputted signal in order to control the output signal level, and thereafter, the limiter works to limit the amplitude of the output signal to less than a predetermined output level.

However, heretofore, such an output level control apparatus was only applied to an analog signal reproducing apparatus because the output level control apparatus was much too complicated to be applied to a digital signal reproducing apparatus.

THE SUMMARY OF THE INVENTION

The present invention is intended to overcome the previously stated difficulty. An object of the present invention is to provide an output level control apparatus which can be successfully applied to a digital signal reproducing apparatus while still providing a comparatively simple structure. This object is accomplished in accordance with the present invention having an output level control apparatus which is operated according to a reproduced signal level from a digital reproducing apparatus. The output level control apparatus according to the present invention comprises, (a) signal level detection means which compares the reproduced signal level with a predetermined reference level to decide if the attenuation level of the reproduced signal should be changed; and (b) output signal level adjusting means which outputs a command signal representing a change in the attenuation level of the reproduced signal to a digital attenuator when a change of attenuation level is decided by the signal level detection means.

The above-stated object is also accomplished in accordance with another embodiment of the present invention by an output level control apparatus which operates according to a reproduced signal level from a digital reproducing apparatus and which comprises:

(a) signal level detection means which compares the reproduced signal level with a predetermined reference level to decide if the attenuation level of the reproduced signal should be changed; and (b) selecting means for outputting a level setting which selects a suitable attenuator from a set of digital attenuators each having different characteristics when the change of attenuation level is decided.

The invention will now be described in further detail with reference to the accompanying drawings. However, the following examples are given merely to aid in the understanding of the present invention, and variations may be made by one skilled in the art without departing from the spirit and scope of the present invention.

DESCRIPTION OF THE PREFERRED EMBODIMENTS

Figure 1:
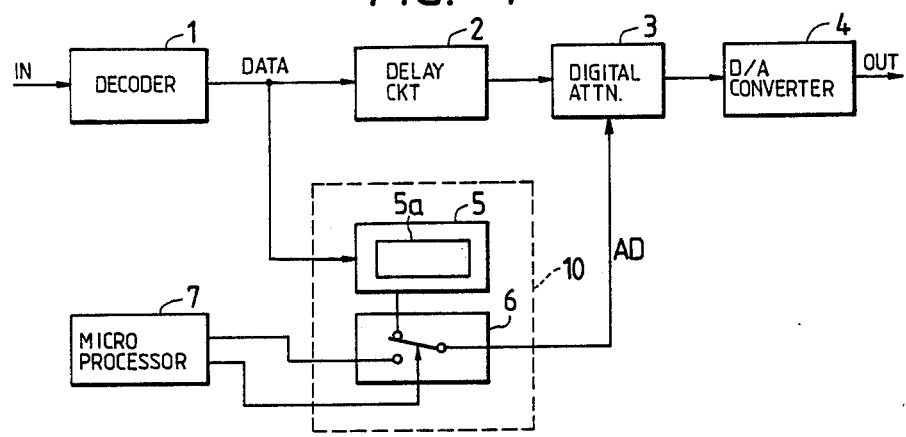
FIG. 1 illustrates a block diagram of the output level control apparatus of the present invention.

In FIG. 1, an output signal IN from a digital reproducing apparatus is supplied to a decoder (1). The output signal (DATA) from decoder (1) is inputted to a digital attenuator (3) through a delay circuit (2) in order to be suppressed to a predetermined required level, and thereafter, the output signal having the predetermined required level is supplied to a digital/analog converter (4) where it is converted to an analog output signal OUT. On the other hand, the output signal (DATA) from the aforesaid decoder (1) is also inputted to a signal level detecting means (5) which is incorporated in a microprocessor (10). The signal DATA represents a digital reproduction signal including information indicating its signal level. The microprocessor 10 including the signal level detecting means 5 serves to decide if the attenuation level of the reproduced signal should be changed. More particularly, the microprocessor 10 decides if the attenuation level of signal (DATA) should be changed according to the procedure illustrated in FIG. 2. The procedure illustrated in FIG. 2 will now be explained.

In Step S101, the microprocessor 10 detects a signal level of the output signal DI (DATA), and compares it with a predetermined reference signal level $L_R$ in Step S102. When in the case DI is not equal to or is not higher than LR ($DI < L_R$) (dB), the procedure moves back to Step S101. Otherwise, it goes to Step S103. Step 103 introduces a comparison level factor L which is originally equal to $L_R$, and increases L by an increment of 1 dB. In other words. Step S103 conducts an adding operation of $L = L + 1$ (dB). In step S104, the detected signal DI is compared with the present value of L, and in the case when DI is equal to or higher than L ($DI \geq L$), the procedure moves back to Step S103. Otherwise it goes to Step S105 which settles a pointer n as a data number which is originally equal to 1. As was described above, when the output signal level DI is higher than the predetermined reference level $L_R$ which means that signal attenuation is required, the procedure goes to the next stage to determine the required attenuation level.

In the storage memory (5a), which may consist of, for example, a ROM, of the signal level detecting means (5), a set of predetermined adjusting values AD1–ADn are beforehand stored in order to be selected in step S106 to thereby decide the attenuation level of the detected output signal DI. When in the case the comparison level factor L is not equal to AD1 (AD1≠L), the procedure goes to the next step S107 to make an adding operation of $n = n + 1$.

As was described above, a set of predetermined adjusting values are compared to L in turn in order of its suffix n. When L is equal to the adjusting value ADn, it is specified as the attenuation level for the digital attenuator (3).

In the embodiment of FIG. 1, a switching mechanism is comprised of an output level adjusting means (6) to supply the selected adjusting value from memory (5a) (i.e., according to Step S106) to the digital attenuator (3). The switching mechanism is employed only when level attenuation is required. In another microprocessor (7), an up/down key is provided in order for users or operators to input a set of adjusting values. This up/down key is operated to set a new series of optional adjusting values of ADn. When a user prefers to select the optional adjusting values, the set of adjusting values are supplied from the microprocessor (7) to the digital attenuator (3) through the output level adjusting means (6).

Figure 2:
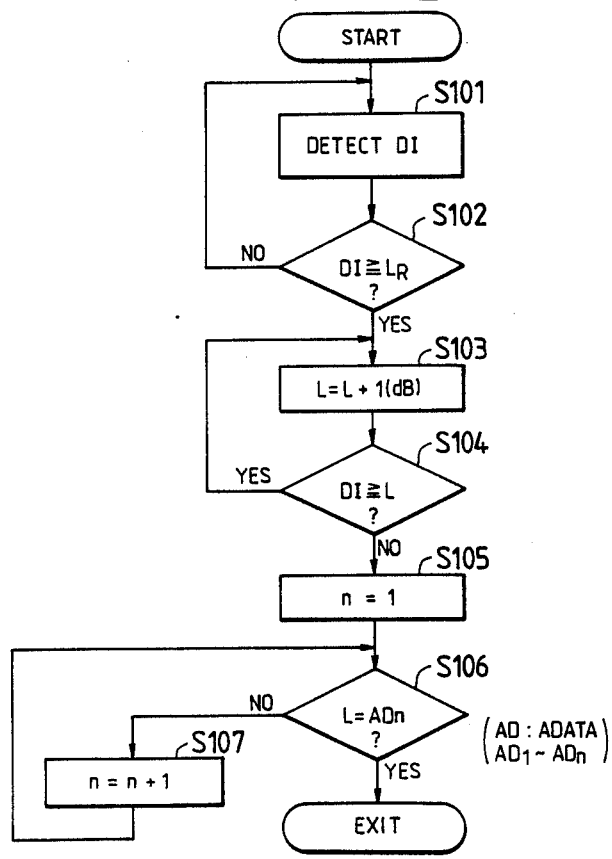
FIG. 2 illustrates a flowchart showing an operating process of the output level control apparatus of FIG. 1.
Figure 3:
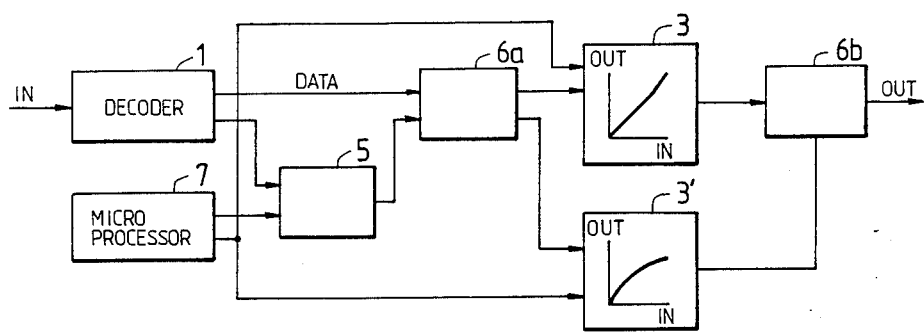
FIG. 3, FIG. 4 and FIG. 5 illustrate other embodiments of the output level control apparatus according to the present invention.

In FIG. 1, a delay circuit (2) is provided to compensate for the time delay at the digital attenuator (3) which results from the procedure for determining an attenuation value as shown in FIG. 2, FIG. 3 shows another embodiment of the present invention which is suitable for the case when the usual delay circuit cannot compensate for the time delay at the digital attenuator (3) because such a long time is required for the procedure shown in FIG. 2 to decide the required attenuation level. In this embodiment, switching mechanisms (6a) and (6b) are operated as the output level selecting means, and when output level attenuation is required, they change in synchronization with each other to provide attenuation from either digital attenuator (3) or from digital attenuator (3'). As shown in FIG. 3, the digital attenuators (3) and (3') have different input/output characteristics from each other. Due to this difference, the digital attenuator (3') can be selected to suppress the higher output level. Thus, according to this embodiment, two attenuators (3) and (3are provided so that attentuation of the decoded signal DATA is performed by either attentuator (3) and (3').

Figure 4:
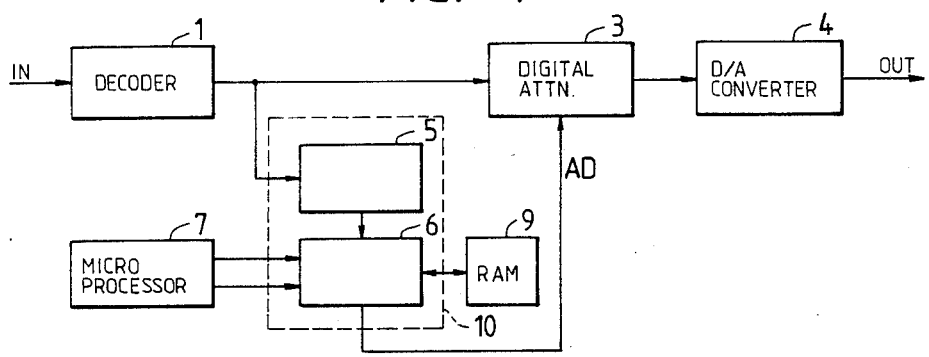

FIG. 4 shows another embodiment of the present invention which is suitable for the case when signals to be reproduced are supplied from a series of programs in which each program has a different output level, such as programs of music from different sources. In this embodiment, whole programs are previously searched to get information on an output level of each program. The average output level of each program is stored through a sampling measurement in RAM (9), and the level adjusting is done under the program with the lowest average output level in order to attain the most preferable result without any level variation between programs. The stored average output levels in RAM (9) are employed to get the adjusting value by AD1-ADn which are supplied from microprocessor (7) for each program with the procedure of FIG. 2 in which a comparison is conducted between the values AD1-ADn and the predetermined reference level $L_R$.

By this kind of structure, the most suitable recording condition can be attained for dubbing from a digital audio disk player with an auto disk changer for example. As the recording level of each digital audio disk is different, previous sampling for level attenuation contributes to the most preferable reproduction and recording with the same level without any level variation for whole programs.

Figure 5:
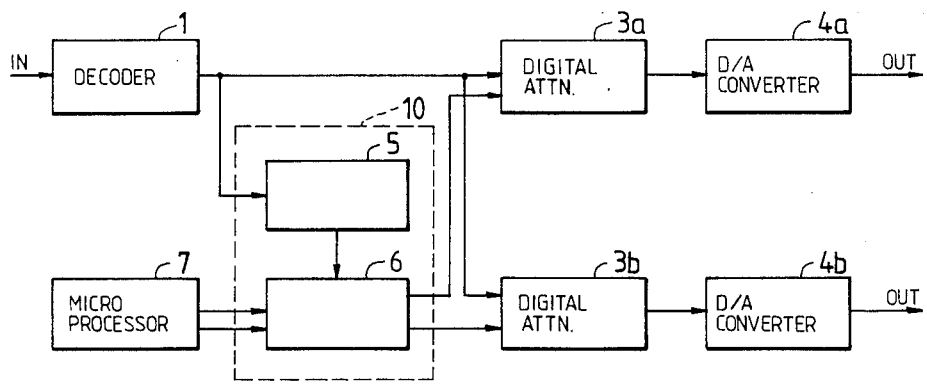

In another embodiment shown in FIG. 5, two digital attenuators (3a) and (3b), along with respective digital/analog converters (4a) and (4b) are provided for reproduction of a stereo phonic signal. This embodiment operates to obtain a level of digital output signals which are balanced according to the independent right and left signals. According to this embodiment, the attenuation value for attentuator (3a) or (3b) is set in advance by the user through the use of the microprocessor (7).

As was described above, in accordance with the present invention, a microprocessor is employed to control the output signal level according to a reproduced signal level. The microprocessor detects the reproduced signal level to decide if its attenuation level should be changed. Thereafter it outputs a signal representing an adjusting value to a digital attenuator or it selects the setting condition of a digital attenuator from a set of attenuators with different characteristics. By these aspects of the present invention, the apparatus for output level control operates to suppress an abrupt change of output signal level or to prevent the occurrence of a peak level variation due to different source of signals which cause distortion in a tape medium during a dubbing operation.

What is claimed is:

1. An output level control apparatus which operates according to the level of a reproduced digital signal from a digital signal reproducing apparatus, the output level control apparatus comprising:
   (a) signal level detection means which compares the level of the reproduced digital signal to be supplied to a digital attenuator with a predetermined reference level to determine if the level of the reproduced digital signal should be changed; and
   (b) output signal level adjusting means which outputs a command signal representing an attenuation level to the digital attenuator when said signal level detection means determines that the level of the reproduced digital signal should be changed.

2. The output level control apparatus according to claim 1, further comprising a decoder for decoding the output of the digital reproducing apparatus, and a delay circuit connected to said decoder and to said digital attentuator, said delay circuit causing a delay of the output of said decoder for a period of time so that said output signal level adjusting means can output the command signal.

3. An output level control apparatus which operates according to a reproduced signal level from a digital reproducing apparatus, the output level control apparatus comprising:
   signal level detection means which compares the reproduced signal level with a predetermined reference level to determine if the level of the reproduced signal should be changed;
   output signal level adjusting means which outputs a command signal representing an attenuation level to a digital attenuator when said signal level detection means determines that the level of the reproduced signal should be changed; and
   memory means for storing information representing a plurality of average output levels, the plurality of average output levels respectively corresponding to the average output levels reproduced from a plurality of different programs, and wherein the predetermined reference level is the lowest average output level of the average output levels stored in said memory means.

4. The output level control apparatus according to claim 1, wherein said signal level detection means and said output signal level adjusting means comprise a microprocessor having memory means for storing information representing a plurality of different attenuation levels, and wherein said command signal which is supplied to said attenuator represents one of said different attenuation levels.

5. The output level control apparatus according to claim 4, further comprising means for changing the information representing the plurality of different attentuation levels.

6. The output level control apparatus according to claim 5, wherein said changing means comprises a microprocessor coupled to said digital attentuator.

7. An output level control apparatus which operates according to the level of a reproduced digital signal from a digital signal reproducing apparatus, the output level control apparatus comprises:
 (a) signal level detection means which compares the level of the reproduced digital signal to be supplied to a set of digital attenuators with a predetermined reference level to determine if the level of the reproduced digital signal should be changed; and
 (b) selecting means for outputting a level setting which selects a suitable attenuator form the set of digital attenuators when said signal level detection means indicates that the level of the reproduced digital signal should be changed, each of said set of digital attenuators having a different attenuation characteristic.

8. The output level control apparatus according to claim 7, further comprising means for changing the attenuation characteristics of each of said set of digital attenuators.

9. The output level control apparatus according to claim 7, further comprising a plurality of digital to analog converters, each of the plurality of said digital to analog converters being connected to the output of a different one of said set of digital attenuators.

10. The output level control apparatus according to claim 9, wherein there are two digital attenuators and two digital to analog converters. and wherein the output of the digital signal reproducing apparatus represents a stereo phonic signal.

* * * * *